United States Patent
Katsumata et al.

(10) Patent No.: US 9,349,644 B2
(45) Date of Patent: May 24, 2016

(54) SEMICONDUCTOR DEVICE PRODUCING METHOD

(71) Applicant: DENSO CORPORATION, Kariya, Aichi-pref. (JP)

(72) Inventors: Takashi Katsumata, Kariya (JP); Hisanori Yokura, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/424,118

(22) PCT Filed: Sep. 3, 2013

(86) PCT No.: PCT/JP2013/005185
§ 371 (c)(1),
(2) Date: Feb. 26, 2015

(87) PCT Pub. No.: WO2014/038176
PCT Pub. Date: Mar. 13, 2014

(65) Prior Publication Data
US 2015/0228540 A1 Aug. 13, 2015

(30) Foreign Application Priority Data

Sep. 5, 2012 (JP) ................................. 2012-195191
Jun. 18, 2013 (JP) ................................. 2013-127545

(51) Int. Cl.
*H01L 21/30* (2006.01)
*H01L 21/768* (2006.01)
(Continued)

(52) U.S. Cl.
CPC ...... *H01L 21/76898* (2013.01); *B81C 1/00095* (2013.01); *B81C 1/00269* (2013.01);
(Continued)

(58) Field of Classification Search
CPC ............ H01L 21/31144; H01L 21/308; H01L 21/76898
USPC .................................................. 438/455, 694
See application file for complete search history.

(56) References Cited

U.S. PATENT DOCUMENTS

2003/0087179 A1   5/2003   Iwasaki
2005/0167812 A1*  8/2005   Yoshida ............ H01L 21/76898
                                                          257/686
(Continued)

FOREIGN PATENT DOCUMENTS

JP          3207827 B2      7/2001
JP          2003-133726 A   5/2003
(Continued)

OTHER PUBLICATIONS

Office Action mailed Mar. 17, 2015 in corresponding JP patent application No. 2013-127545 (and English translation).
(Continued)

*Primary Examiner* — Julio J Maldonado
*Assistant Examiner* — Hajar Kolahdouzan
(74) *Attorney, Agent, or Firm* — Posz Law Group, PLC

(57) ABSTRACT

In a method for producing a semiconductor device having a through electrode structure, a masking material is formed so as to bridge over a through hole formed in a second semiconductor substrate, and a hole is formed in the masking material at a position corresponding to the through hole. A contact hole is formed in an insulating film via this hole. In such a method, even if there is a large level difference from the surface of the second semiconductor substrate to the bottom of the through hole, only the masking material bridged over the through hole is exposed by photolithography. Therefore, photolithography for a large level difference is not necessary. As a result, the hole can be formed in the masking material successfully, and the contact hole can be formed successively by an anisotropic dry etching via this hole, even in the case where etching for a large level difference is performed.

5 Claims, 6 Drawing Sheets

(51) Int. Cl.
    *H01L 21/311*   (2006.01)
    *B81C 1/00*   (2006.01)
    *H01L 21/306*   (2006.01)
    *H01L 21/308*   (2006.01)

(52) U.S. Cl.
    CPC ........ *H01L21/308* (2013.01); *H01L 21/30604* (2013.01); *H01L 21/31116* (2013.01); *H01L 21/31144* (2013.01); *B81C 2203/0118* (2013.01); *B81C 2203/0792* (2013.01); *H01L 2924/0002* (2013.01)

(56) References Cited

U.S. PATENT DOCUMENTS

| | | | |
|---|---|---|---|
| 2006/0001173 A1 | 1/2006 | Yamano et al. | |
| 2006/0180933 A1 | 8/2006 | Kanamori et al. | |
| 2006/0267210 A1 | 11/2006 | Yamano et al. | |
| 2009/0160290 A1 | 6/2009 | Tsuda et al. | |
| 2009/0289345 A1* | 11/2009 | Tsai .................. | H01L 21/76898 257/690 |

FOREIGN PATENT DOCUMENTS

| | | |
|---|---|---|
| JP | 2005-266166 A | 9/2005 |
| JP | 2010-114201 A | 5/2010 |
| JP | 2010-232400 A | 10/2010 |

OTHER PUBLICATIONS

International Search Report of the International Searching Authority mailed Oct. 15, 2013 in the corresponding PCT application No. PCT/JP2013/005185 (and English translation).

Written Opinion of the International Searching Authority mailed Oct. 15, 2013 in the corresponding PCT application No. PCT/JP2013/005185 (and English translation).

Office Action mailed Jul. 29, 2014 in the corresponding JP Application No. 2013-127545 (and English translation).

* cited by examiner

SEMICONDUCTOR DEVICE PRODUCING METHOD

CROSS REFERENCE TO RELATED APPLICATIONS

The present disclosure is a U.S. national stage application of PCT/JP2013/005185 filed on Sep. 3, 2013 and is based on Japanese Patent Applications No. 2012-195191 filed on Sep. 5, 2012 and No. 2013-127545 filed on Jun. 18, 2013, the disclosures of which are incorporated herein by reference.

TECHNICAL FIELD

The present disclosure relates to a semiconductor device producing method for forming a through electrode structure in a semiconductor substrate.

BACKGROUND ART

Conventionally, a multi-layer structure made by bonding two semiconductor substrates has been used for the purposes of high functionalization of a semiconductor chip and protection of an element forming a sensor with a MEMS (micro electro mechanical systems) structure from an external environment. In a semiconductor device having such a structure, a through electrode structure is used to make electric conduction between the substrates, and to lead out a potential of each part formed inside of the bonded semiconductor substrates. To form such a through electrode structure, for example, a method indicated in a patent literature 1 is generally used.

As a method for forming the through electrode structure, for example, a through hole is formed in one of the semiconductor substrates and an insulating film is formed on a periphery or the like of the through hole by a thermal oxidation process, before the two semiconductor substrates are bonded to each other. Thereafter, the semiconductor substrate in which the through hole has been coated with the insulating film is bonded to a support substrate, and then the through hole is filled with a metal by a plating process. Further, the semiconductor substrate is separated from the support substrate, and then is bonded to the other of the semiconductor substrates. In this way, the through hole is formed in one of the semiconductor substrates, and is filled with the metal. Thereafter, the one of the semiconductor substrates is bonded to the other of the semiconductor substrates. As a result, the through electrode structure is formed.

PRIOR ART LITERATURE

Patent Literature

Patent Literature 1: Japanese Patent No. 3751625 B2.

SUMMARY OF INVENTION

In a case where the through electrode structure is formed by the method indicated by the patent literature 1, since the support substrate is used, a production process is complicated. Also, since various steps are performed before the substrates are bonded, the surface of the substrate is roughed or the substrate is deformed. As a result, a bonding quality is affected. For example, the surface of the substrate is roughed due to an influence caused by separation from the support substrate, or the like. The deformation of the substrate is, for example, caused by a difference of coefficient of expansion between the metal filled in the through hole or the inside and the semiconductor substrate.

Therefore, in the semiconductor device with the multi-layer structure, it is preferable to form the through electrode after the two semiconductor substrates are bonded to each other. In such a case, however, it is necessary to form a contact hole in an insulating film located at a bottom of the through hole from a front surface side of the substrate, and to pattern a wiring pattern while protecting a metal film inside of the through hole. That is, it is necessary to perform photolithography and etching steps with a large level difference, which is difficult to realize. Therefore, it is desired to properly realize the large level difference photolithography and etching process.

As an example of a case that requires the large level difference photolithography and etching process, the through electrode structure of the multi-layer semiconductor device made of the two bonded semiconductor substrates has been mentioned above. The large level difference photolithography and etching process may be required also in other cases. That is, the large level difference photolithography and etching process is required in a case of etching a thin film disposed inside of a recessed portion formed adjacent to a surface of a semiconductor substrate, at a predetermined position of the bottom of the recessed portion. It is desired to successfully realize the large level difference photolithography and etching process.

Considering the foregoing issues, it is a first object of the present disclosure to provide a semiconductor device producing method, which is capable of successfully realizing a large level difference photolithography and etching process to etch a predetermined position at a bottom of a recessed portion that is formed adjacent to a surface of a semiconductor substrate. It is a second object of the present disclosure to provide a semiconductor device producing method, which is capable of forming a through electrode structure by successfully performing a high level difference etching, while restricting an occurrence of a rough surface or deformation of a substrate before bonding substrates, and without requiring a support substrate.

According to an aspect of the present disclosure, a semiconductor device producing method includes: preparing a semiconductor substrate formed with a recessed portion adjacent to a surface of the semiconductor substrate; forming a thin film on an inner wall surface of the recessed portion; arranging a masking material on the thin film so that the masking material bridges over the recessed portion while remaining an inside of the recessed portion as a cavity, after the forming of the thin film; forming a hole in the masking material at a position corresponding to the recessed portion; and performing a processing of removing the thin film at the position corresponding to the hole through the hole by an anisotropic dry etching using the masking material.

As described above, the masking material is formed to bridge over the recessed portion, and the hole is formed in the masking material at the position corresponding to the recessed portion. Further, the thin film is etched through this hole. In such a producing method, even if there is a large level difference from the surface of the semiconductor substrate to the bottom of the recessed portion, only the masking material, which is bridged over the recessed portion, is exposed by the photolithography, and it is not necessary to perform a photolithography through a large level difference. Therefore, the hole can be successfully formed in the masking material. In addition, even in the etching through the large level difference, the contact hole can be successfully formed by the anisotropic dry etching through the hole. As such, the large level difference photolithography and etching process, which is difficult to realize, can be successfully realized.

According to a second aspect of the present disclosure, a semiconductor device producing method includes: preparing a first semiconductor substrate formed with an element and a connection portion; bonding a second semiconductor substrate to a surface of the first semiconductor substrate; forming a through hole in the second semiconductor substrate after being bonded to the first semiconductor substrate by etching the second substrate at a position corresponding to the connection portion from a surface opposite to the first semiconductor substrate; forming an insulating film on the surface of the second semiconductor substrate including an inner wall surface of the through hole and the connection portion exposed inside of the through hole; arranging a first masking material on the insulating film so that the first masking material bridges over the through hole while remaining an inside of the through hole as a cavity, after the forming of the insulating film; forming a hole in the first masking material at a position corresponding to the through hole; and forming a contact hole to expose the connection portion for contacting the connection portion with a conductive layer by removing the insulating film at a position corresponding to the hole through the hole by an anisotropic dry etching using the first masking material.

As described above, the first masking material is formed to bridge over the through hole, and the hole is formed in the first masking material at the position corresponding to the through hole. The contact hole is formed in the insulating film through the hole. In such a producing method, even if there is a large level difference from the surface of the second semiconductor substrate to the bottom of the through hole, only the first masking material bridged over the through hole is exposed by the photolithography, and a photolithography with a large level difference is not necessary. As such, the hole can be successfully formed in the masking material, and the contact hole can be successfully formed even by the etching with the large level difference by the anisotropic dry etching through the hole. Accordingly, the large level difference photolithography and etching process, which is difficult to realize, can be successfully realized.

As such, the through electrode structure is successfully formed. In such a semiconductor device producing method, further, the first semiconductor substrate and the second semiconductor substrate are bonded to each other before the through hole is formed. Therefore, it is not necessary to use the support substrate as a conventional method. Also, it is less likely that the surface of the substrate will be roughed and the substrate will be deformed. Accordingly, the through electrode structure can be formed by successfully performing the large level difference etching without requiring the support substrate and restricting the occurrence of the rough surface and the deformation of the substrate.

According to a third aspect of the present disclosure, in the forming of the hole in the semiconductor device producing method according to the second aspect, the hole has a diameter smaller than a diameter of the through hole.

In such a hole, a normal line of the second semiconductor substrate passing through the hole does not pass through a portion of the insulating film formed on a side wall surface of the through hole. Therefore, in the anisotropic dry etching, only a portion of the insulating film disposed on the bottom of the through hole can be removed without damaging the side wall of the through hole.

BRIEF DESCRIPTION OF DRAWINGS

The above and other objects, features and advantages of the present disclosure will become more apparent from the following detailed description made with reference to the accompanying drawings, in which.

Figure 1:
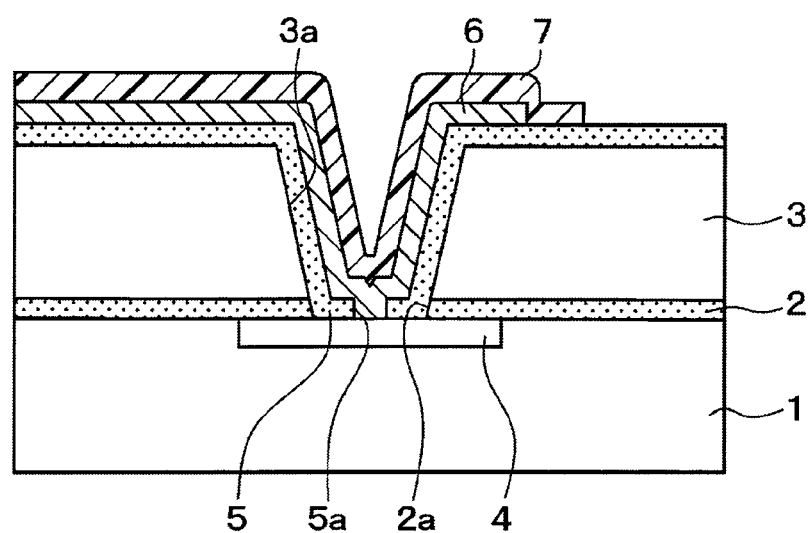
FIG. 1 is an enlarged cross-sectional view of a through electrode structure of a semiconductor device that is produced by a semiconductor device producing method according to a first embodiment of the present disclosure.
Figure 2:
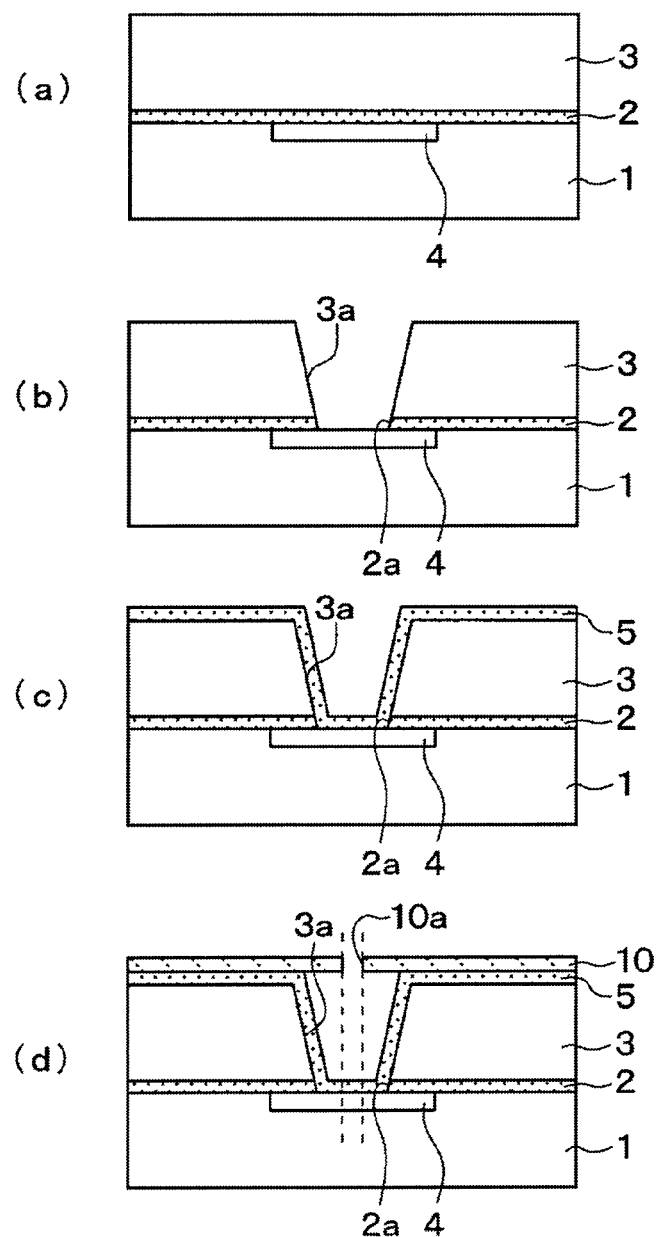
Figure 3:
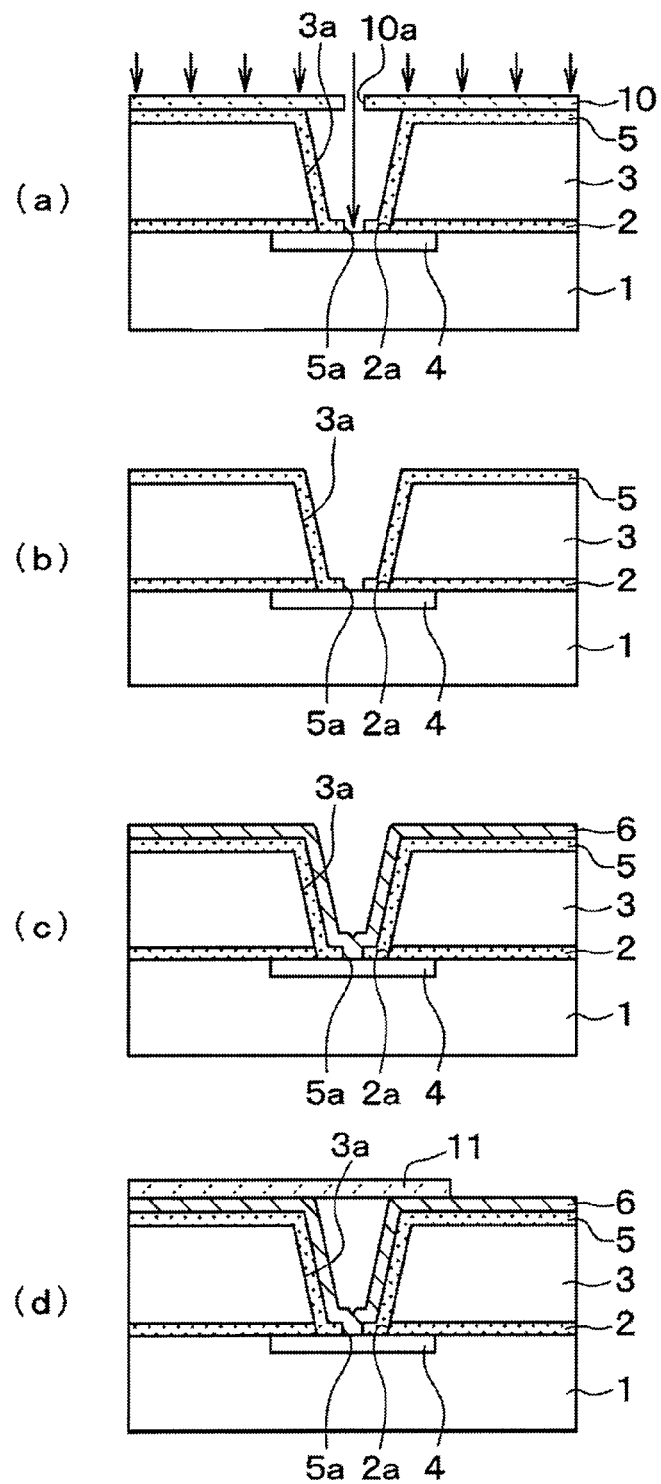
Figure 4:
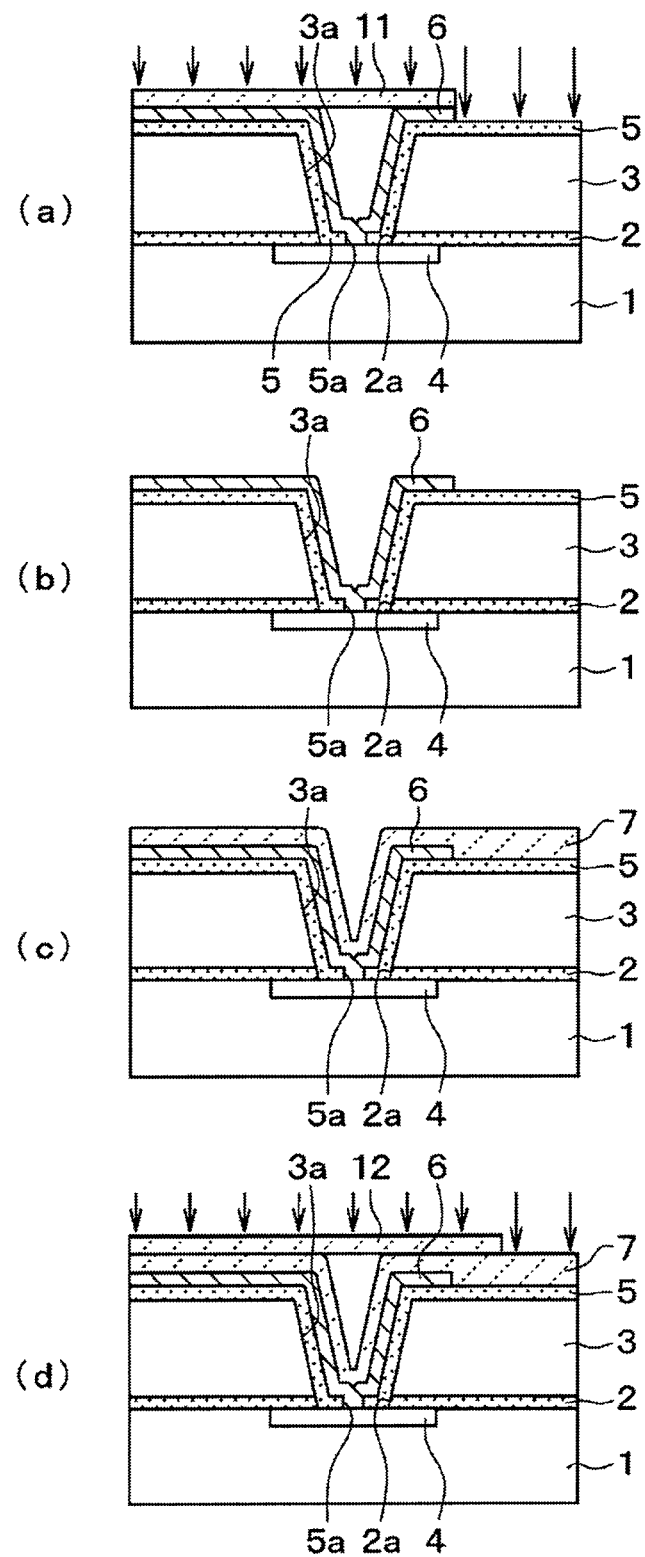
Figure 5:
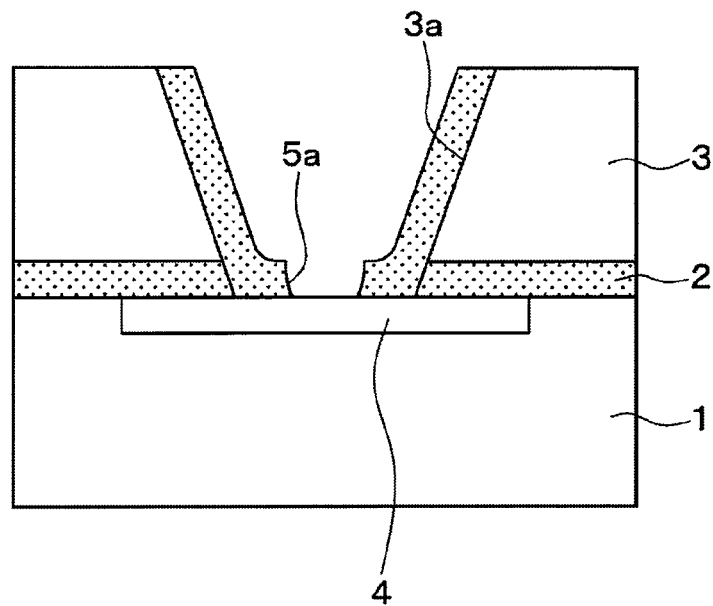
Figure 6:
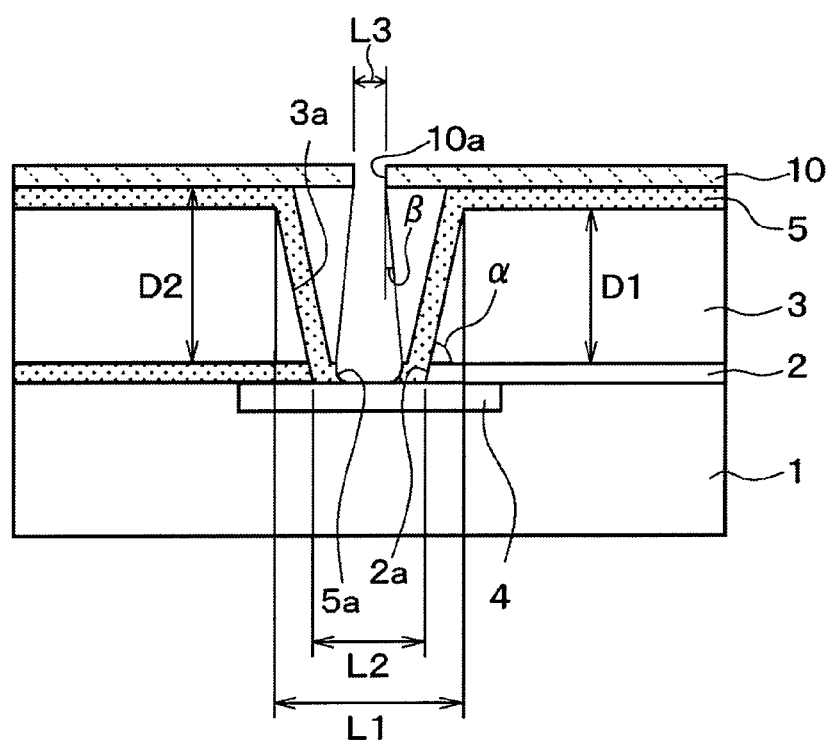
Figure 7:
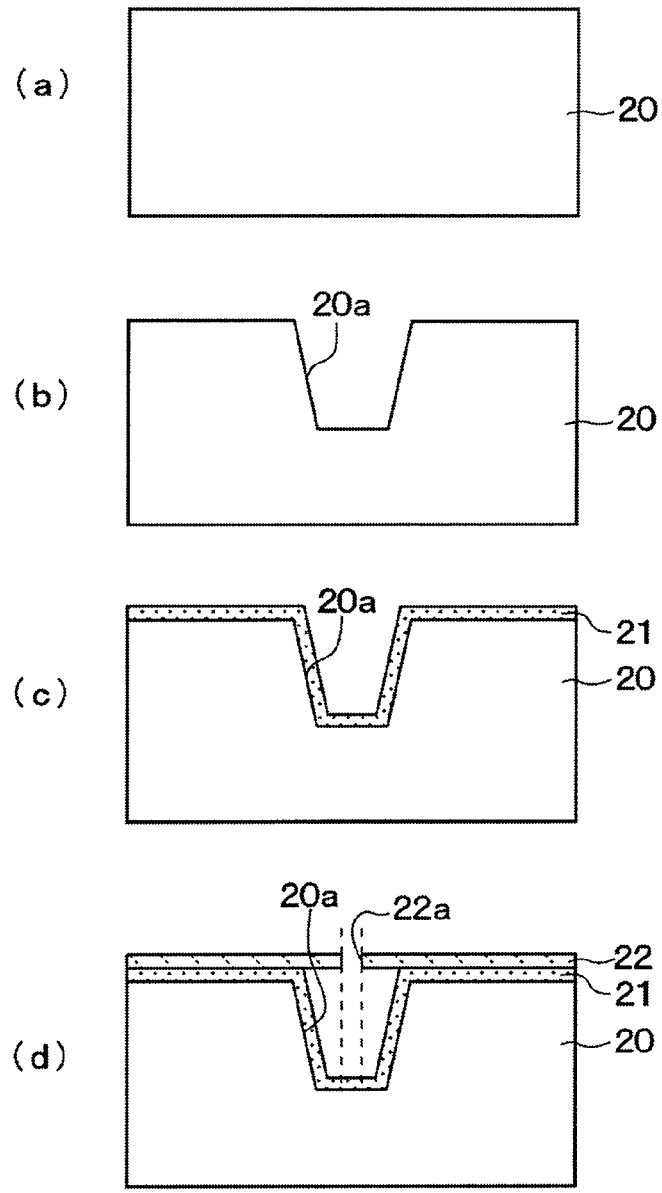

(a) to (d) of FIG. 2 are cross-sectional views illustrating a producing process of the through electrode structure of the semiconductor device shown in FIG. 1;

(a) to (d) of FIG. 3 are cross-sectional views illustrating a producing process subsequent to the producing process shown in (a) to (d) of FIG. 2;

(a) to (d) of FIG. 4 are cross-sectional views illustrating a producing process subsequent to the producing process shown in (a) to (d) of FIG. 3;

FIG. 5 is an enlarged view of a part in the vicinity of a contact hole 5a;

FIG. 6 is a cross-sectional view illustrating relationships of dimensions of respective parts of a through hole 3a and dimensions of respective parts of a masking material 10; and (a) to (d) of FIG. 7 are cross-sectional views illustrating a producing process of an etching processing part of a semiconductor device that is produced by a semiconductor device producing method according to another embodiment.

DESCRIPTION OF EMBODIMENTS

Hereinafter, embodiments of the present disclosure will be described with reference to the drawings. The embodiments are described hereinafter by designating the same or equivalent parts with the same reference numbers.

First Embodiment

A first embodiment of the present disclosure will be described. Hereinafter, of a semiconductor device made by bonding two semiconductor substrates, only a part associated with a through electrode structure will be described. However, the semiconductor device is actually provided with other elements. The present disclosure can be applied to various semiconductor devices provided with such a through electrode structure. For example, the present disclosure can be applied to a semiconductor device in which a semiconductor substrate forming a wiring pattern is bonded to a semiconductor substrate formed with an integrated circuit. Also, the present disclosure can be applied to a semiconductor device in which a semiconductor substrate forming a cap is bonded to a front surface of a semiconductor substrate formed with a sensor with a MEMS structure such as an acceleration sensor.

Referring to FIG. 1, a through electrode structure of a semiconductor device produced by a semiconductor producing method according to the present embodiment will be firstly described.

As shown in FIG. 1, a first semiconductor substrate 1 is formed with an integrated circuit and a sensor having a MEMS structure, and a second semiconductor substrate 3 is bonded to a front surface of the first semiconductor substrate 1 through an insulating film 2 made of an oxidation film or the like. For example, the first semiconductor substrate 1 and the second semiconductor substrate 3 are made of silicon substrate.

A connection portion 4 is formed on the front surface of the first semiconductor substrate 1, and the connection portion 4 is exposed from a contact hole 2a of the insulating film 2, which is formed at a position corresponding to the connection portion 4. The connection portion 4 is a portion to be electrically connected to a desired position of the first semiconductor substrate 1. For example, in a case where the first semiconductor substrate 1 is provided with an integrated circuit or the like, the connection portion 4 is provided as a pad that connects to a wiring pattern extending from the integrated circuit on the front surface of the first semiconductor substrate 1. For example, in a case where the first semiconductor substrate 1 is provided with a sensor having a MEMS structure, the connection portion 4 is provided as a diffusion layer that makes electrical connection with each part of the MEMS structure. In a case where the sensor is an acceleration sensor having a movable electrode and a fixed electrode, the connection portion 4 is electrically connected to the fixed electrode or the movable electrode. The diffusion layer or the like is generally electrically connected when being extended to each part of the MEMS structure. Alternatively, there is a case where the first semiconductor substrate 1 doped with impurities is used as a wiring. In such a case, the connection portion 4 made of the diffusion layer is connected to each part of the MEMS structure through the first semiconductor substrate 1.

The second semiconductor substrate 3 is formed with a through hole 3a at a position corresponding to the connection portion 4. The through hole 3a penetrates through the second semiconductor substrate 3 from a front surface to a rear surface. The contact hole 2a formed in the insulating film 2 described above is formed at a position corresponding to the through hole 3a.

A front surface of the second semiconductor substrate 3, including an inner wall surface of the through hole 3a, and an exposed surface of the connection portion 4 are covered with an insulating film 5. The insulating film 5 is also formed with a contact hole 5a at a position corresponding to the connection portion 4. Therefore, the connection portion 4 is exposed also from the insulating film 5 through the contact hole 5a within the through hole 3a.

A conductive layer 6, which is made of a metal, is patterned on the surface of the insulating film 5 including the inside of the through hole 3a and the inside of the contact hole 5a. Since the conductive layer 6 contacts the connection portion 4 though the contact hole 5a, the electric connection from the front surface of the second semiconductor substrate 3 to the connection portion 4 is implemented through the conductive layer 6. Therefore, the potential of the connection portion 4 provided in the first semiconductor substrate 1 can be taken out from the front surface of the second semiconductor substrate 3 opposite to the first semiconductor substrate 1 through the through hole 3a and the contact holes 2a and 5a.

In addition, a passivation film 7 is formed to cover a surface of the conductive layer 6, if necessary. Thus, the conductive layer 6 and elements formed in the first semiconductor substrate 1 can be protected. In such a case, the passivation film 7 is removed at a desired position to expose the conductive layer 6, and the potential of the connection portion 4 can be taken out from the exposed portion as a pad.

Next, a producing method of the semiconductor device configured as described above will be described with reference to (a) of FIG. 2 through (d) of FIG. 4. It is to be noted that the semiconductor device is actually provided with other elements and the like, though only the part of the through electrode structure is illustrated.

[Step Shown in (a) of FIG. 2]

Firstly, a first semiconductor substrate 1 in which an integrated circuit, elements such as sensors with the MEMS structure, and the connection portion 4 are formed by a conventional method is prepared. Also, a second semiconductor substrate 3 is prepared. The insulating film 2 is formed on a rear surface of the second semiconductor substrate 3, that is, on a surface of the second semiconductor substrate 3 that is to be bonded to the first semiconductor substrate 1. For example, the insulating layer 2 is formed on the rear surface of the second semiconductor substrate 3 by forming an oxide film by thermal oxidation or the like. Then, the second semiconductor substrate 3 is placed on the front surface of the first semiconductor substrate 1, that is, on the surface of the first semiconductor substrate 1 on which the connection portion 4 has been formed. The first semiconductor substrate 1 and the second semiconductor substrate 3 are bonded to each other through the insulating film 2, such as by direct bonding. Further, the second semiconductor substrate 3 is grinded and polished from the front surface, if necessary, to adjust the thickness suitable for formation of the through electrode structure. For example, it is preferable to set the thickness of the second semiconductor substrate 3 in a range from several tens μm to approximately 200 μm (for example, 100 μm).

[Step Shown in (b) of FIG. 2]

An etching mask (not shown) is arranged on the front surface of the second semiconductor substrate 3. The etching mask is formed with an opening at a position corresponding to a region where the through hole 3a is to be formed. Then, etching is carried out for the second semiconductor substrate 3 using the etching mask, so that the through hole 3a, which penetrates through the second semiconductor substrate 3 from the front surface to the rear surface, is formed in the second semiconductor substrate 3 and the contact hole 2a is formed in the insulating film 2. The through hole 3a may be formed such that a side wall surface of the through hole 3a is perpendicular to the front surface of the second semiconductor substrate 3. However, the through hole 3a is preferably formed into a forward taper shape in which an area of opening gradually reduces from the front surface toward the rear surface of the second semiconductor substrate 3. In the case where the through hole 3a is formed into such a forward taper shape, the insulating film 5 and the conductive layer 6 are favorably attached to the side wall surface of the through hole 3a when the insulating film 5 and the conductive layer 6 are formed in the through hole 3a in later steps.

Although the method of forming the through hole 3a into the forward taper shape has been conventionally known and thus a detail description thereof will be omitted, the through hole 3a having the forward taper shape can be easily formed only by setting an etching condition. For example, it is preferable that a diameter of the through hole 3a on the front surface of the second semiconductor substrate 3 is set to a range from approximately 50 μm to approximately 150 μm, and a taper angle, which is an angle defined between the rear surface of the second semiconductor substrate 3 and the inner wall surface of the through hole 3a, is in a range from 70 to 80°.

[Step Shown in (c) of FIG. 2]

The insulating film 5 is formed on the front surface of the second semiconductor substrate 3, including the inner wall surface of the through hole 3a and the surface of the connection portion 4 exposed from the through hole 3a, by a CVD technique, a thermal oxidation, and the like. Even in the case of employing the CVD technique, when the inner wall surface of the through hole 3a has the forward taper shape as described above, the insulating film 5 can be formed on and properly attached also to the inner wall surface of the through hole 3a.

[Step Shown in (d) of FIG. 2]

A masking material 10 (a first masking material) is formed by carrying out a film-formation of a tenting method to the front surface of the second semiconductor substrate 3, by a spin coating of a photoresist, a dry film attachment, or the like.

In this case, the masking material 10 is bridged over the through hole 3a while remaining the inside of the through hole 3a as a cavity and is configured to cover the insulating film 5 and the second semiconductor substrate 3 as base materials. Further, through a photolithography step, a hole 10a having a diameter smaller than a diameter of the through hole 3a is formed in the masking material 10 at a position corresponding to the through hole 3a. The diameter of the hole 10a is, for example, approximately 20 to 50 μm. Although the thickness of the masking material 10 is arbitrary, the thickness of the masking material 10 is adjusted so that a thermal expansion of gas in the cavity of the through hole 3a can be suppressed during baking before exposure in the photolithography step.

As a resist material for forming the masking material 10, for example, PMER P-CT700XP (brand name) made by TOKYO OHKA KOGYO., LTD. can be used. Further, if necessary, an additive is mixed to the resist material to increase a surface tension of the resist material. When a low-speed spin coating or the like is performed in a state where the surface tension of the resist material is increased by the additive, the masking material 10 can be formed into a tenting shape without falling down into the through hole 3a.

[Step Shown in (a) of FIG. 3]

A part of the insulating film 5 is removed by an anisotropic dry etching using the masking material 10 to form the contact hole 5a in the insulating film 5 at a position to which the hole 10a is projected in a direction of normal to the substrate. In such an etching, a normal line of the second semiconductor substrate 2 passing through the hole 10a does not pass through the portion of the insulating film 5 formed on the side wall surface of the through hole 3a. Therefore, only the portion of the insulating film 5 located on the bottom of the through hole 3a can be removed without damaging the side wall of the through hole 3a. When the contact hole 5a is formed in this manner, a side wall surface of the contact hole 5a has a rounded shape, as shown in an enlarged cross-section of FIG. 5. Therefore, it is possible to improve a filling property (coverage property) of the conductive layer 6, which is formed in a later step, in the contact hole 5a.

[Steps Shown in (b) and (c) of FIG. 3]

As shown in (b) of FIG. 3, the masking material 10 is removed. Thereafter, as shown in (c) of FIG. 3, the conductive layer 6 made of a metal is formed on an entire surface of the insulating film 5 including the inside of the contact hole 5a. For example, the conductive layer 6 is formed by a sputtering or a CVD technique.

[Step Shown in (d) of FIG. 3]

Similarly to the masking material 10, a masking material 11 (second masking material) is formed by a tenting method. Also in this case, the masking material 10 is formed to bridge over the through hole 3a while remaining the inside of the through hole 3a as a cavity and to cover the conductive layer 6 and the second semiconductor substrate 3 as base materials, including the inside of the through hole 3a. Through a photolithography step, the portion of the masking material 11 corresponding to an unnecessary portion of the conductive layer 6 is removed to form an opening.

[Step Shown in (a) of FIG. 4]

The conductive layer 6 is patterned by partly removing the conductive layer 6 through the etching using the masking material 11. In such an etching, since the masking material 11 covers the through hole 3a, the conductive layer 6 can be removed without damaging the side wall of the through hole 3a.

[Steps Shown in (b) and (c) of FIG. 4]

As shown in (b) of FIG. 4, the masking material 11 is removed. Thereafter, as shown in (c) of FIG. 4, a passivation film 7, such as a nitride film, is formed to cover an entire surface of the conductive layer 6 including the inside of the through hole 3a. For example, the passivation film 7 is formed by a spin coating technique.

[Step Shown in (d) of FIG. 4]

Similarly to the masking materials 10 and 11, a masking material 12 (third masking material) is formed again by a tenting method. Also in this case, the masking material 12 is formed to bridge over the through hole 13a while remaining the inside of the through hole 3a as a cavity and to cover the conductive layer 6 as the base material including the inside of the through hole 3a. Through a photolithography step, a portion of the masking material 12 corresponding to an unnecessary portion of the passivation layer 7 is removed to form an opening. Thereafter, the unnecessary portion of the passivation film 7 is removed by an etching using the masking material 12, and then the masking material 12 is removed. As such, the semiconductor device having the through electrode structure shown in FIG. 1 is finished.

In the present embodiment, as described above, the masking material 10 is formed to bridge over the through hole 3a, and the hole 10a is formed in the masking material 10 at the position corresponding to the through hole 3a. The contact hole 5a is formed in the insulating film 5 through the hole 10a. In such a producing method, even if there is a large level difference between the front surface of the second semiconductor substrate 3 and the bottom of the through hole 3a, only the masking material 10 bridged over the through hole 3a is exposed in the photolithography step. Further, a photolithography step with a large level difference is not necessary. Therefore, the hole 10a is successfully formed in the masking material 10. In addition, even in the etching with the large level difference, the contact hole 5a is successfully formed by the anisotropic dry etching through the hole 10a. Therefore, a large level difference photolithography and etching process (photolithography step and large level difference etching step), which is difficult to realize, can be successfully realized.

Also in the patterning of the conductive layer 6 and the passivation film 7, the masking materials 11 and 12 are similarly bridged over the through hole 3a. Therefore, even if there is a large level difference from the surface of the conductive layer 6 and the passivation film 7 to the bottom of the through hole 3a, only the masking materials 11 and 12 bridged over the through hole 3a are exposed by the photolithography step, and there is no large level difference. Therefore, similarly to the above, the large level difference photolithography and etching process, which is difficult to realize, can be successfully realized.

Therefore, the through electrode structure can be successfully formed. In such a producing method of the semiconductor device, the first semiconductor substrate 1 and the second semiconductor substrate 3 are bonded to each other before the through hole 3a is formed. Therefore, it is not necessary to use the support substrate, as a conventional method. Also, occurrence of the rough surface of the substrate or deformation of the substrate before the bonding of the substrates can be reduced. Accordingly, the occurrences of the rough surface of the substrate and the deformation of the substrate before the bonding of the substrates can be reduced without requiring the support substrate, and the through electrode structure can be formed by successfully performing the large level difference etching.

The diameter of the through hole 3a, the taper angle defined between the rear surface of the second semiconductor substrate 3 and the inner wall surface of the through hole 3a, the diameter of the hole 10a of the masking material 10, and the thickness of the second semiconductor substrate 3 to which the through hole 3a is formed, that is, the depth of the through hole 3a are set to the values as described above. The reasons thereof will be described with reference to FIG. 6.

As described above, because the diameter of the hole 10a is smaller than the diameter of the through hole 3a, the normal line of the second semiconductor substrate 3 passing through the hole 10a does not pass through the portion of the insulating film 5 formed on the side wall surface of the through hole 3a. Therefore, the side wall of the through hole 3a is not damaged during the etching. However, as described with reference to FIG. 5, when the contact hole 5a is formed by removing the portion of the insulating film 5, the side wall surface of the contact hole 5a actually has the rounded shape. The side wall surface of the contact hole 5a has the rounded shape because the cavity remains in the through hole 3a by arranging the masking material 10 in the tenting shape and the etching for forming the contact hole 5a is performed while expanding in a radial direction, as shown in FIG. 6.

Since the etching is performed while expanding in the radial direction, the filling property of the conductive layer 6 in the contact hole 5a can be improved. On the contrary, since the etching is performed while expanding in the radial direction, if the diameter of the through hole 3a is excessively small or depending on the taper angle of the through hole 3a, the insulating film 5 formed on the side surface of the through hole 3a is also etched. Therefore, the diameter of the through hole 3a, the diameter of the hole 10a of the masking material 10 and the taper angle of the through hole 3a need to be set so as to avoid etching the insulating film 5 formed on the side wall surface of the through hole 3a. The diameter of the through hole 3a and the diameter of the hole 10a can be obtained in the following manner.

First, the diameter of the through hole 3a on an opening side (diameter on the front surface opposite to the first semiconductor substrate 1) is referred to as L1. The diameter of the through hole 3a on the surface adjacent to the first semiconductor substrate 1 is referred to as L2. The diameter of the hole 10a is referred to as L3. The taper angle of the through hole 3a is referred to as α, and an expanding angle of the etching is referred to as β. The depth of the through hole 3a, that is, the thickness of the second semiconductor substrate 3 in the case of the present embodiment, is referred to as D1. A distance from the surface of the insulating film 5 on the outside of the through hole 3a to the surface of the second semiconductor substrate 3 adjacent to the first semiconductor substrate 1 is referred to as D2.

In this case, the depth D1 of the through hole 3a can be expressed by an equation 1. Also, the diameter L2 of the through hole 3a adjacent to the first semiconductor substrate 1 in the equation 1 can be expressed by an equation 2.

$$D1 = (L1-L2)/2 \tan \alpha \quad \text{(Ex. 1)}$$

$$L2 = L1 - 2D1/\tan \alpha \quad \text{(Ex. 2)}$$

The etching diameter of the insulating film 5 at the end of the through hole 3a adjacent to the first semiconductor substrate 1 needs to be smaller than the diameter L2 of the through hole 3a adjacent to the first semiconductor substrate 1. Therefore, an equation 3 is given. Further, since the distance D2 is substantially equal to the thickness D1 of the second semiconductor substrate 3 (D1≈D2), the D2 can be replaced with the D1.

$$L2 \geq L3 + 2D2 \tan \beta (\approx L3 + 2D1 \tan \beta) \quad \text{(Ex. 3)}$$

The expanding angle β of the etching is a constant determined according to the etching condition and the like. Therefore, when the depth D1 of the through hole 3a and the diameters L1 to L3 are set while considering the expanding angle β determined according to the etching condition and satisfying the above described equations 1 to 3, it is possible to restrict the insulating film 5 formed on the side wall surface of the through hole 3a from being etched.

When the diameter L1 on the opening side of the through hole 3a and the diameter L2 of the through hole 3a adjacent to the first semiconductor substrate 1 are large, the effects described above can be achieved. However, if the diameter L1 of the though hole 3a on the opening side is excessively large, there is a problem arise, such as a part of the masking material 10 entering the through hole 3a when being bridged over the through hole 3a. Likewise, when the diameter L1 of the through hole 3a on the opening side is excessively large, it is difficult to suppress the thermal expansion of gas in the cavity defined in the through hole 3a during the baking before the exposure. The upper limit of the diameter L1 of the through hole 3a on the opening side is preferably set considering these issues.

Each value is preferably set in the above described manner. For example, when the thickness of the second semiconductor substrate 3, that is, the depth D1 of the through hole 3a is several tens to 200 μm, as described above, it is preferable that the diameter L1 of the through hole 3a on the opening side is 50 to 150 μm, and the taper angle α is 70 to 80°, and the diameter L3 of the hole 10a is 20 to 50 μm.

Other Embodiments

In the embodiment described above, the structure in which the conductive layer 6 is extended on the front surface of the second semiconductor substrate 3, for example, the mode in which the conductive layer 6 forms the wiring pattern is indicated, as shown in FIG. 1. However, it may be configured that the conductive layer 6 is remained only on the periphery of the through hole 3a to form a pad.

In the embodiment described above, as an example of the semiconductor device, the semiconductor device provided with the integrated circuit and the MEMS structure is mentioned. However, the above semiconductor device is just an example, and the semiconductor device may be provided with any other elements. The semiconductor device may have any structure as long as the semiconductor device is provided by bonding the first semiconductor substrate 1 and the second semiconductor substrate 3 to each other, and the potential of the connection portion 4 of the first semiconductor substrate 3 is led out through the through hole 3a that penetrates through the second semiconductor substrate 3 from the front surface toward the first semiconductor substrate 1.

In the embodiment described above, as an example of requiring the large level difference photolithography and etching process, the through electrode structure in the multilayer structure semiconductor substrate provided by the first and second semiconductor substrate 1 and 3 bonded to each other is mentioned. That is, in the structure where the two semiconductor substrates 1 and 3 are bonded to each other through the insulating film 2 to form an integrated semiconductor substrate, and a recessed portion provided by the through hole 3a is formed on one side of the integrated semiconductor substrate (adjacent to the second semiconductor substrate 3), the insulating film 5 as a thin film is exemplarily provided in the recessed portion. However, the large level difference photolithography and etching process may be also required in other cases.

Namely, in a case where a semiconductor substrate having a recessed portion adjacent to a surface is prepared, and a step of etching is performed to a predetermined portion of a bottom part of a thin film disposed in the recessed portion, the large level difference photolithography and etching process is required. Also in this case, the similar effects to the first embodiment can be achieved by performing the following steps subsequently. First, as shown in (a) of FIG. 7, a semiconductor substrate 20 is prepared. Then, as shown in (b) of FIG. 7, a step of forming a recessed portion 20a on a surface of the semiconductor substrate 20 is performed. Next, as shown in (c) of FIG. 7, a step of forming a thin film 21 on an inner wall surface of the recessed portion 20a is performed. Thereafter, as shown in (d) of FIG. 7, a step of arranging a masking material 22 on the thin film 21 to bridge over the recessed portion 20a is performed. Further, a step of forming a hole 22a in the masking material 22 at a position corresponding to the recessed portion 20a is performed by a photolithography. Thereafter, a step of removing the thin film 21 at a position corresponding to the hole 22a is performed through the hole 22a by an anisotropic dry etching through the hole 22a. In this way, the thin film 21 can be etched on the bottom wall of the recessed portion 20a. The large level difference photolithography and etching process, which is difficult to realize, can be successfully realized.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

The invention claimed is:

1. A producing method for a semiconductor device, the semiconductor device having:
    a first semiconductor substrate having a connection portion adjacent to a surface of the first semiconductor substrate to be connected to an element; and
    a second semiconductor substrate bonded to the surface of the first semiconductor substrate, wherein
    the second semiconductor substrate includes a through electrode structure having a through hole formed in the second semiconductor substrate from a front surface opposite to the first semiconductor substrate and a conductive layer disposed in the through hole and connected to the connection portion,
    the producing method comprising:
    preparing the first semiconductor substrate formed with the element and the connection portion;
    bonding the second semiconductor substrate to the surface of the first semiconductor substrate;
    after the bonding of the second semiconductor substrate to the surface of the first semiconductor substrate, forming the through hole by etching the second semiconductor substrate from the front surface opposite to the first semiconductor substrate at a position corresponding to the connection portion of the second semiconductor substrate;
    forming an insulating film on the front surface of the second semiconductor substrate, including an inner wall surface of the through hole and the connection portion exposed from the through hole;
    after the forming of the insulating film, arranging a first masking material on the insulating film so that the first masking material bridges over the through hole while remaining an inside of the through hole as a cavity;
    forming a hole in the first masking material at a position corresponding to the through hole by photolithography;
    forming a contact hole in the insulating film to expose the connection portion for contacting the connection portion with the conductive layer, by removing the insulating film at a position corresponding to the hole through the hole by an anisotropic dry etching using the first masking material;
    after the forming of the contact hole, contacting the conductive layer with the connection portion through the contact hole by forming the conductive layer on a surface of the insulating film including an inside of the contact hole;
    after the forming of the conductive layer, arranging a second masking material on the conductive layer so that the second masking material bridges over the through hole while remaining the inside of the through hole as a cavity;
    forming an opening in the second masking material at a position corresponding to an unnecessary portion of the conductive layer by photolithography; and
    patterning the conductive layer by removing the unnecessary portion of the conductive layer by etching using the second masking material.

2. The producing method according to claim 1, wherein in the forming of the hole, the hole is formed to have a diameter smaller than a diameter of the through hole.

3. The producing method according to claim 1, wherein in the forming of the through hole, the through hole is formed into a forward tapered shape such that an area of opening of the through hole gradually reduces as a function of distance from the front surface of the second semiconductor substrate opposite to the first semiconductor substrate.

4. The producing method according to claim 1, further comprising:
    after the patterning of the conductive layer, forming a passivation film on the conductive layer;
    after the forming of the passivation film, arranging a third masking material on the passivation film so that the third masking material bridges over the through hole while remaining the inside of the through hole as a cavity;
    forming an opening in the third masking material at a position corresponding to an unnecessary portion of the passivation film; and
    patterning the passivation film by removing the unnecessary portion of the passivation film by etching using the third masking material.

5. The producing method according to claim 1, wherein in the forming of the contact hole in the insulation film, the contact hole being formed with a rounded shape.

* * * * *